US006224836B1

(12) United States Patent
(10) Patent No.: US 6,224,836 B1
(45) Date of Patent: May 1, 2001

Moisan et al.

(54) DEVICE FOR EXCITING A GAS BY A SURFACE WAVE PLASMA AND GAS TREATMENT APPARATUS INCORPORATING SUCH A DEVICE

(75) Inventors: Michel Moisan, Outremont; Roxane Etemadi, Montreal, both of (CA); Jean-Christophe Rostaing, Buc (FR)

(73) Assignee: L'Air Liquide, Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 09/066,653

(22) Filed: Apr. 27, 1998

(30) Foreign Application Priority Data

Apr. 25, 1997 (FR) .................................................. 97 05147

(51) Int. Cl.[7] ............................. B01J 19/08; C23C 16/00

(52) U.S. Cl. ............................................ 422/186; 118/723

(58) Field of Search .............................. 422/186; 118/723

(56) References Cited

U.S. PATENT DOCUMENTS 4,698,822 10/1987 Leprince et al. .
4,745,337 * 5/1988 Pichot et al. .................... 315/111.41
4,944,244 * 7/1990 Moisan et al. ............... 118/723 MW
5,037,666 8/1991 Mori .
5,072,157 * 12/1991 Greb et al. ........................... 315/248
5,360,485 * 11/1994 Bou et al. ...................... 118/723 ME
5,389,153 * 2/1995 Paranjpe et al. .............. 118/723 MP
5,478,532 * 12/1995 Uhm .................................... 422/186
5,597,624 * 1/1997 Blinov et al. ................. 118/723 MP
5,750,823 * 5/1998 Wofford et al. ...................... 588/210

FOREIGN PATENT DOCUMENTS 415122 8/1989 (EP) .

* cited by examiner

*Primary Examiner*—Kathryn Gorgos
*Assistant Examiner*—Thao Tran
(74) *Attorney, Agent, or Firm*—Burns, Doane, Swecker & Mathis, L.L.P.

(57) ABSTRACT

Device for exciting a gas comprising a hollow structure forming a waveguide, made of an electrically conductive material, connected to a microwave generator and including a passage for a hollow dielectric tube adapted for flow of the gas to be excited, the hollow structure further including a wave-concentrating region designed to concentrate microwave radiation produced by the generator onto the tube, during operation of the device, for the purpose of producing a surface wave plasma in the gas, at least one electromagnetic screening sleeve made of a conductive material, fastened to the hollow structure and extending along the extension of the passage so as to surround the hollow tube.

18 Claims, 5 Drawing Sheets

| Flow rates ($SF_6$, $O_2$, Ar) (ml/min) | Type of applicator | Minimum power for 100% destruction (W) |
|---|---|---|
| 25, 30, 500 | Surfaguide | 710 |
| 25, 30, 500 | Surfatron-guide | 610 |

FIG. 2

| Flow rates ($C_2F_6$, $O_2$, Ar) (ml/min) and % $C_2F_6$ | Type of applicator | Minimum maintaining power (W) | Degree of destruction % |
|---|---|---|---|
| 25, 30, 500 (4.5%) | Surfaguide | 790 | 97 |
| 25, 30, 500 (4.5%) | Surfatron-guide | 790 | >99.8 |
| 50, 60, 500 (8.2%) | Surfaguide | 1075 | <45 |
| 50, 60, 500 (8.2%) | Surfatron-guide | 1030 | 99.5 |

FIG. 3

| Coaxial sleeves | Flow rates ($C_2F_6$, $O_2$, Ar) (ml/min) and % $C_2F_6$ | Actual maintaining power (W) | Degree of destruction % |
|---|---|---|---|
| with | 50, 60, 500 (8.2%) | 1075 | <45 |
| without | 50, 60, 500 (8.2%) | 1075 | 99.6 |

FIG. 7

DEVICE FOR EXCITING A GAS BY A SURFACE WAVE PLASMA AND GAS TREATMENT APPARATUS INCORPORATING SUCH A DEVICE

This application claims priority under 35 U.S.C. §§119 and/or 365 to 97-05,147 filed in France on Apr. 25, 1997; the entire content of which is hereby incorporated by reference.

BACKGROUND OF THE INVENTION (i) Field of the Invention

The present invention relates to a device for exciting a gas, of the surfaguide type, in which the gas is excited by a surface wave plasma, in particular an atmospheric-pressure surface wave plasma.

The invention also relates to an apparatus for treating a gas incorporating such an excitation device.

Another effective exciting device for this application is known by the name "surfatron-guide".

(ii) Description of Related Art

One particularly advantageous application example of these types of devices is the plasma treatment of a chemically non-reactive gas containing impurities consisting of perfluorinated greenhouse-effect gaseous compounds or of volatile organic compounds.

To do this, the gas to be treated and the impurities which it contains are placed in an electric field which is intense enough to produce an electrical discharge by ionizing the gas molecules, this discharge being caused by stripping off electrons from the initially neutral gas molecules.

Under the action of the discharge, the molecules of the gas are dissociated in order to form radicals of smaller sizes than the initial molecules and, consequently, when appropriate, individual atoms, these atoms or fragments of molecules thus excited not appreciably giving rise to any chemical reaction.

Thus, after passing through the discharge, the gas atoms or molecules become de-excited and recombine respectively, before becoming intact again on leaving the discharge.

In contrast, the impurities undergo, by excitation, irreversible dissociation and irreversible transformation by forming new molecular fragments having chemical properties different from those of the initial molecules, which are consequently capable of being extracted from the gas by an appropriate subsequent treatment.

A surfatron-guide has a hollow structure made of an electrically conductive material, having a first end closed off by a moveable waveguide plunger forming a short-circuit and a second part which extends perpendicularly to the first part and in which is coaxially mounted a tube made of a dielectric material, through which tube the gas to be treated flows.

The second part is provided with a tuning plunger which can move axially in order to adapt the impedance of the device.

This type of electromagnetic field applicator is satisfactory for creating a surface wave plasma at atmospheric pressure.

However, it has a certain number of drawbacks, in particular due to its cost, because of the greater complexity of its construction.

However, another type of gas-exciting device is known, this being called a "surfaguide".

This type of excitation device has a hollow structure forming a waveguide, made of electrically conductive material, which is intended to be connected to a microwave generator provided with a passage through which a hollow discharge tube made of a dielectric material is intended to pass, the gas to be excited flowing through the tube, and with a wave-concentrating region designed to concentrate the microwave radiation produced by the generator onto the tube, during operation of the device, for the purpose of producing a surface wave plasma in the gas.

The surfaguide has no tuning plunger and is therefore less expensive than the surfatron-guide. Furthermore, the length of the plasma created by the surfaguide is, for the same power, slightly longer than that of the plasma created by the surfatron-guide.

However, the density of the plasma column produced by the surfatron-guide is locally higher than for the surfaguide.

In addition, under certain operating conditions, the surfaguide is less effective than the surfatron-guide when discharge tubes having a diameter greater than 20 mm are used at a frequency of 2.45 Ghz.

Moreover, for high operating powers, radiation losses occur in the environment of the surfaguide, these being highly prejudicial to the energy balance of the device and also causing reliability and safety problems.

SUMMARY AND OBJECTS OF THE INVENTION

The object of the invention is to help to overcome the drawbacks of the devices of the state of the art and to provide a device for exciting a gas which is less expensive than the surfatron-guide and is capable also of working at atmospheric pressure.

The subject of the invention is therefore a device for exciting a gas, of the surfaguide type, comprising a hollow structure forming a waveguide, made of an electrically conductive material, this hollow structure being intended to be connected to a microwave generator and provided with a passage through which a hollow dielectric tube is intended to pass, the gas to be excited flowing through the tube, and with a wave-concentrating region designed to concentrate the microwave radiation produced by the generator onto the tube, during operation of the device, for the purpose of producing a surface wave plasma in the gas, characterized in that it furthermore includes at least one electromagnetic screening sleeve, made of a conductive material, fastened to the structure and extending along the extension of the passage so as to surround the hollow tube.

The exciting device according to the invention may furthermore include one or more of the following characteristics:

- the hollow structure forming a wave-guide has a longitudinal general shape and includes a first open end intended to be connected to the microwave generator, a second open end intended to be provided with means forming a guide short-circuit, and a region of narrowed cross-section which extends between the first end and the second end and delimits the wave-concentrating region;
- the region of narrowed cross-section includes a central part of constant cross-section equipped with the passage and extending between two parts of cross-sections which increase linearly towards the ends;
- the at least one sleeve has a length at least equal to the length of the plasma created in the gas;

the free end of each sleeve has a flange provided with a hole for passage of the dielectric tube;

the at least one sleeve has a length equal to the sum of the length of the plasma and of the wavelength of the microwave radiation in vacuum;

the wall of the at least one sleeve is provided with at least one orifice for viewing the plasma, the dimensions of which are designed to prevent penetration of the radiation;

the at least one sleeve has a cylindrical general shape of cross-section at least equal to twice the cross-section of the hollow tube;

it includes two sleeves which extend along the extension of one with respect to the other, on each side of the central part;

each sleeve includes an end mounting plate, each mounting plate extending laterally beyond the central part for the purpose of fixing the sleeves to the structure, by bolting the mounting plates together; and the diameter of the passage is greater than the external diameter of the hollow tube.

The subject of the invention is also an apparatus for treating a gas, comprising a device for exciting the gas which is connected to a microwave generator and through which a hollow dielectric tube passes, the gas to be excited flowing through the tube, the device comprising means for concentrating the microwave radiation produced by the generator onto the dielectric tube so as to produce, in the gas, an atmospheric plasma for ionizing and exciting the molecules of the gas to be treated for the purpose of forming reactive gaseous compounds, the apparatus furthermore including at least one unit for treating the reactive compounds, these units being placed on the downstream side of the hollow dielectric tube, characterized in that the device for exciting the gas consists of an excitation device as defined above.

Other features and advantages will emerge from the following description, given solely by way of example and with reference to the appended drawings.

BRIEF DESCRIPTION OF THE DRAWINGS

FIGS. 2 and 3 are tables showing the respective efficiencies of the surfaguide of FIG. 1 and of a surfatron-guide;

FIG. 7 is a table showing the respective efficiencies of the exciting device according to the invention and of the surfaguide of FIG. 1.

DETAILED DESCRIPTION OF PREFERRED EMBODIMENTS

Figure 1:
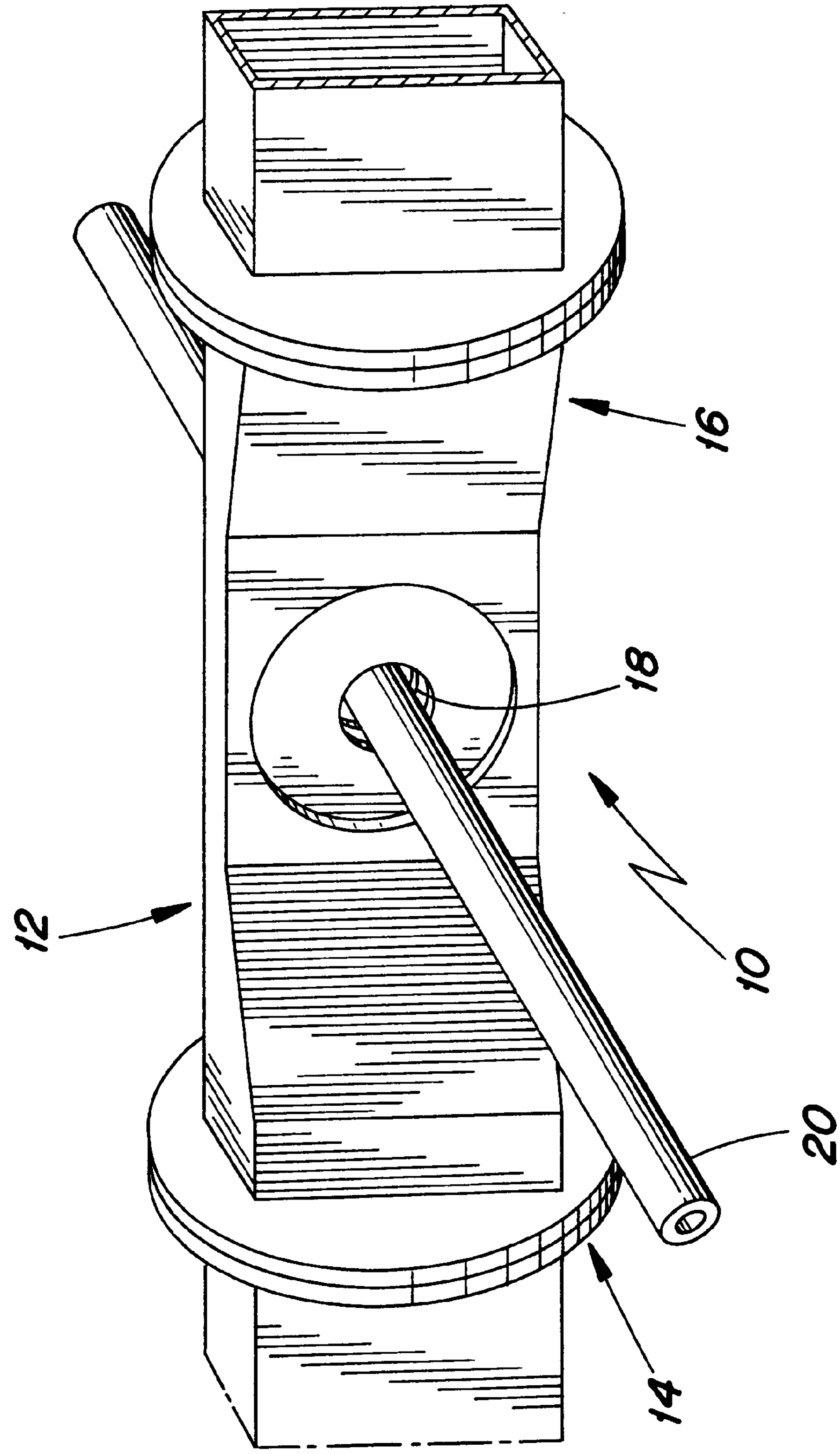
FIG. 1 PRIOR ART
FIG. 1 is a diagrammatic view in perspective of a surfaguide of conventional type.

Illustrated in FIG. 1 is a diagrammatic view in perspective of a surfaguide of conventional type, denoted by the general numerical reference 10.

The surfaguide 10 consists mainly of a hollow structure 12 made of an electrically conductive material, provided with a first end 14 intended to be connected to a microwave generator (not shown) and with an open opposite end 16 intended to be closed off by a plate arranged transversely with respect to the longitudinal axis of the structure 12 and constituting a short-circuit. In this FIG. 1, the plate of the short-circuit has not been shown.

The wall of the central part of the structure 12 is provided with transverse orifices 18 for the passage of a discharge tube 20 made of a dielectric material, through which tube a gas column flows.

In operation, the microwave radiation produced by the microwave generator is guided by the structure 12 which concentrates the incident radiation onto the tube 20 so as to propagate, in the latter and in the ionized gas mixture which it contains, a travelling electromagnetic surface wave, the associated electric field of which generates and maintains the discharge in the gas column.

As mentioned previously, this type of exciter can be used in the field of the plasma treatment of gaseous effluents of various types for the purpose of purifying them or of destroying perfluorocarbon compounds or volatile organic compounds contained in a gas mixture, by excitation of the gas mixture and subsequent treatment designed to make the excited chemical species react under the action of the plasma with a corresponding reactive compound so as to eliminate them from the incoming gas or gas mixture.

However, as indicated previously, this type of exciter has a certain number of drawbacks.

First of all, it may be seen in FIG. 2 that the minimum incident power necessary to achieve 100% elimination of $SF_6$, in a gas mixture consisting, for example, of $SF_6$, $O_2$ and Ar must be greater than the power necessary to achieve 100% destruction with a surfatron-guide for identical flow rates.

Moreover, by comparing the degrees of destruction obtained in the case of a gas mixture containing $C_2F_6$, for incident microwave powers which are very similar between the conventional surfaguide on the one hand and the surfatron-guide on the other hand, it may be seen that, for a $C_2F_6$ concentration equal to 4.5%, the power necessary to maintain a stable discharge is only 790 W for both types of applicator. Under these conditions, the degree of destruction achieved with the surfaguide is only slightly less than that observed in the case of the surfatron-guide.

However, at a higher $C_2$F6 concentration, equal to 8%, the minimum power for maintaining a stable discharge is markedly higher. This power varies little between the two devices, but the destruction efficiency becomes poor in the case of the surfaguide, especially compared with the excellent value, close to unity, observed in the case of the surfatron-guide. Correspondingly, and as mentioned previously, for these high powers, significant radiation losses occur in the environment of the device, these losses therefore being highly prejudicial to the energy balance of the apparatus and causing reliability and safety problems.

Figure 4:
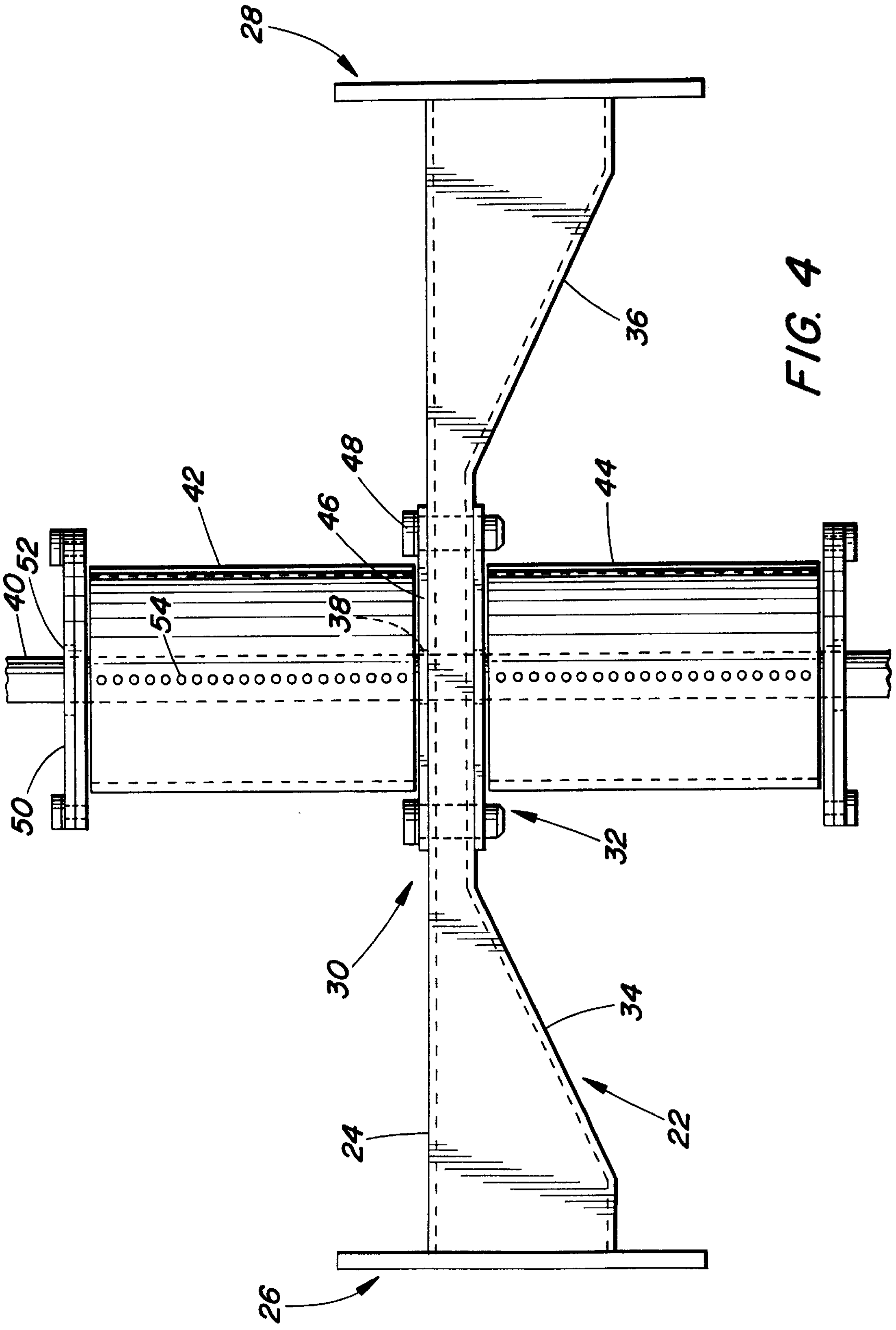
FIG. 4 is a diagrammatic side view of the excitation device according to the invention.
Figure 5:
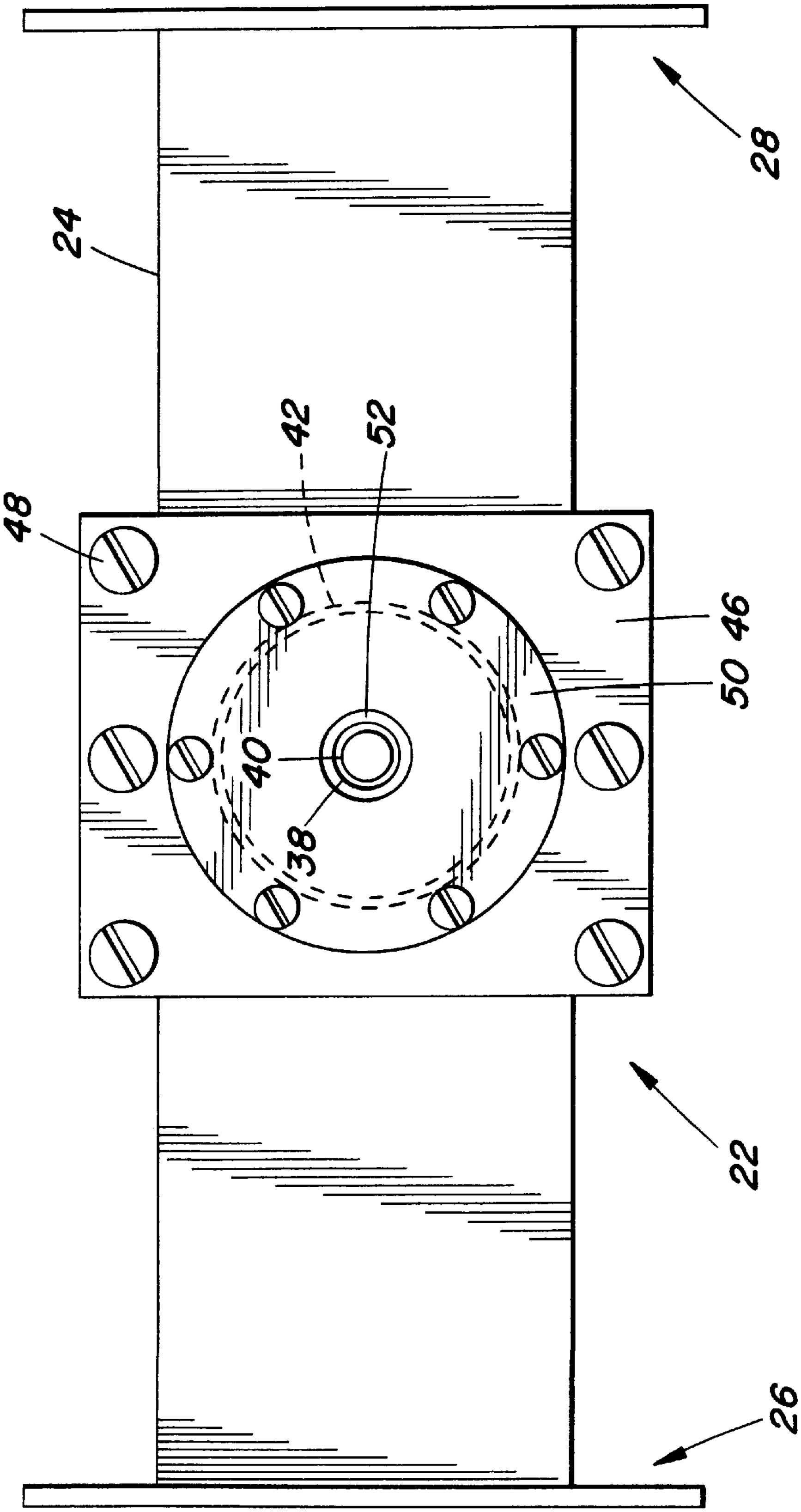
FIG. 5 is a top view of the device of FIG. 4.

Illustrated in FIGS. 4 and 5 is a gas-exciting device which makes it possible to alleviate these drawbacks.

FIG. 4 shows that the exciter, denoted by the numerical reference 22, has a hollow structure 24 of longitudinal shape and made of an electrically conductive material appropriate for the envisaged use, in particular a metal.

The hollow structure 24 preferably has a parallelepipedal cross-section and includes two open ends, respectively 26 and 28, one end being intended to be connected to a microwave generator and the other end to suitable means for forming a short-circuit, preferably a conductive plate placed transversely and longitudinally adjustable.

Between the two end regions 26 and 28, the structure 24 has a region 30 of narrowed cross-section, including a central part 32 of constant cross-section extending between two parts 34 and 36 of cross-section which increases linearly towards the end regions 26 and 28.

Referring also to FIG. 5, it may be seen that the walls making up the central part 32 are each equipped with an orifice, such as 38, these orifices forming a passage for a tube 40 made of a dielectric material, such as silica, fictitiously truncated in FIG. 4, through which tube a gas column to be excited flows.

According to the invention, a sleeve, 42 and 44, is mounted on each of the large faces of the central part 32, this sleeve being made of an electrically conductive material which is preferably identical to the material of which the structure 24 is composed. The sleeves are preferably cylindrical and placed coaxially with respect to the passage formed by the orifices 38.

It is recognized that these sleeves 42 and 44 must be made of a material which is electrically a good conductor. Furthermore, the contact of these sleeves with the structure 24 must be electrically excellent. This is because, for electromagnetic waves having a frequency of 2.45 GHz, any discontinuity in the electrical conduction would be likely to provide a leakage path to the outside for the radiation produced by the generator, even with very tight mechanical fit.

Thus, the structure 24 and the sleeves 42 and 44 are preferably made of brass so as to prevent an insulating oxide layer being created in the region for fixing these components.

FIGS. 4 and 5 also. show that those ends of the sleeves 42 and 44 which are mounted so as to face the waveguide 24 are each equipped with a mounting plate, such as 46, these mounting plates 46 being clamped against the central part 32 with the aid of bolts, such as 48. Thus, a very close mechanical contact of the metal surfaces is obtained.

Moreover, the free ends of the sleeves 42 and 44 are each provided with a flange, such as 50, which is fixed by bolting it to the free ends, the latter being provided with an orifice, such as 52, for passage of the dielectric tube 40.

As will be mentioned below, the flanges 50 may be made of an. electrically conductive material or insulating material, or they can optionally be omitted depending on the length of the sleeves.

Finally, in FIG. 4, it may be seen that the wall of each sleeve is provided with orifices 54 which make it possible to look at the plasma in the gas column during operation of the device.

In operation, the waveguide 24 guides the incident microwave radiation coming from the generator towards the region 30 of narrowed cross-section, which constitutes a region for concentrating the microwaves, in particular onto the dielectric tube 40.

This is because the region 30 of narrowed cross-section concentrates the incident radiation onto the central part 32 for the purpose of propagating, in the tube 40 and in the gas column which it contains, a travelling electromagnetic surface wave, the associated electrical field of which generates and maintains a plasma in the gas column for the purpose, conventionally, of exciting and ionizing the gas particles.

It will be noted that, in order to prevent multiple reflections from appearing in the two transition parts 34 and 36, which are liable to give rise to a spatial variation in the phase of the wave different from that of a waveguide of constant cross-section, the transition between the two end zones and the central part 32 is substantially gradual, by using a transition-region length which is approximately equal to a multiple of half the propagation wavelength $\lambda_g/2$ in the waveguide 24.

Moreover, it should be noted that the diameter of each of the sleeves must be chosen to be large enough not to disturb the propagation of the surface wave creating the discharge.

This choice is dictated by two considerations.

On the one hand, if this diameter is too small, the microwave field in the wall of the sleeve may become very high, the value of the associated electric field decreasing approximately exponentially from the wall of the tube 40. Thus, since the conductivity of the metal is not infinite, heating losses may appear in the constituent wall of the sleeves, it being possible, in addition, for this heating to damage the sleeves.

Thus, the minimum diameter depends on the microwave power which it is desired to inject into the plasma, i.e. on the operating conditions of the device. Preferably, so as to limit the losses, the minimum diameter of the sleeve is chosen to be equal to twice that of the tube 40.

On the other hand, if the diameter is too large, the structure of the electromagnetic field may lose its travelling surface wave character and couplings of the resonant-cavity type occur, which will make the operating regime of the discharge unstable by energy exchange between the cavity modes and that of the surface wave.

A compromise between these two considerations consists in choosing a diameter of between three and four times the diameter of the tube 40, i.e., for example, a diameter of between 60 and 80 mm for an incident frequency of 2.45 GHz.

It should also be noted that the length of the sleeves is chosen to be at least equal to the length of the plasma, so that the latter lies entirely within the sleeves.

If the length of the sleeves is only very slightly greater than that of the plasma, the flanges 50 are preferably made of an electrically conductive material so as to prevent the radiation from escaping to the outside.

However, as was mentioned previously, these flanges 50 are not necessarily made of a conductive material, since the intensity of the microwave field is small in this region beyond the limit of the plasma.

In particular, for a sleeve length equal to the sum of the length of the plasma and of the wavelength of the radiation, the intensity of the radiation is substantially zero in the end edge of the sleeves 42 and 44. In this case, the flanges 50 may be omitted.

It may be seen that the surfaguide device just described has a very simple structure. It has only a single impedance-matching means, connected to one of the ends of the waveguide structure 24, on the opposite side from the inlet for the microwaves coming from the generator, whereas the surfatron-guide has an additional intrinsic matching means. However, it may be advantageous to add to the waveguide, on the microwave-power inlet side, an impedance matcher consisting of three screw-type plungers in the large side of the guide, of known type.

However, it does allow an efficiency comparable to that of the surfatron-guide to be achieved.

The description of a complete apparatus for treating a gas using the excitation device described above will now be given with reference to FIG. 6.

The apparatus illustrated in this figure is, for example, intended for the destruction of $C_2F_6$ in a gas mixture consisting, for example, of $C_2F_6$, $O_2$ and Ar introduced into the discharge tube 40 via one of its ends, as indicated by the arrow F.

This figure shows that the surfaguide 22, identical to the exciter shown in FIGS. 4 and 5, is connected via one of its ends 26 to a microwave generator 56, the other end 28 being equipped with a conductive plate 58 forming a short-circuit, this plate being placed transversely and being longitudinally adjustable.

Downstream, with respect to the direction of flow of the gas to be treated, the discharge tube 40 runs into a pipe 60 via a cooling cartridge 62 consisting, for example, of a heat exchanger equipped with a coil, through which the gas to be treated flows, contained in a chamber inside which water circulates.

The pipe 60 conveys the gas excited by the action of the plasma 64 to a treatment unit 66, consisting of a cartridge containing an element suitable for reacting with the excited chemical species which have to be destroyed, for example an alkaline element such as soda lime or an alkaline aqueous solution, and then to a dehydration unit 68.

Figure 6:
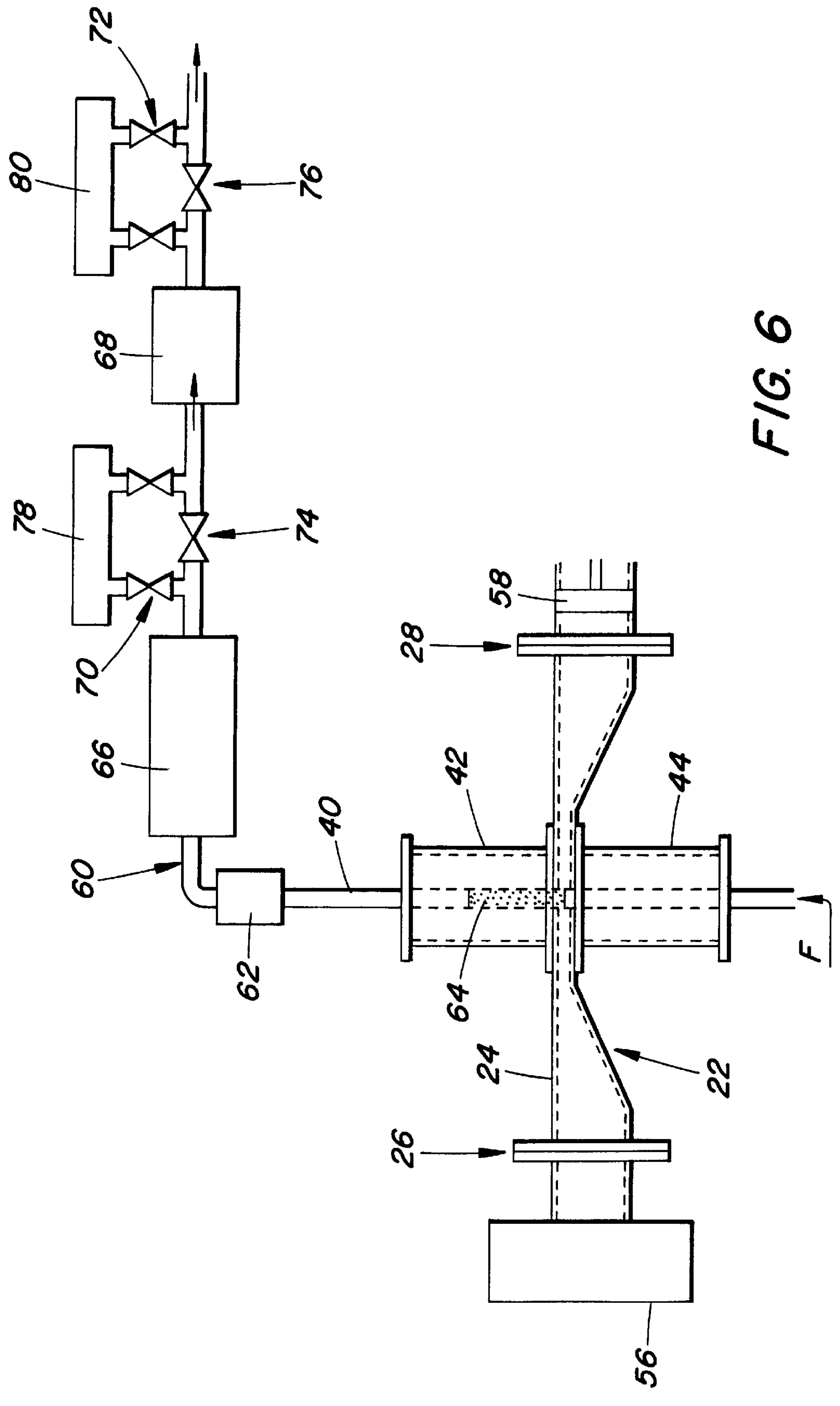
FIG. 6 is a diagrammatic view of an apparatus for treating a gas using the excitation device of FIGS. 4 and 5.

Moreover, FIG. 6 shows that the pipe 60 has two branch-off assemblies 70 and 72 controlled by corresponding valves, such as 74 and 76, on which branch-off assemblies are mounted, in a leaktight manner, sampling cells 78 and 80 capable of analyzing the gases by Fourrier transform infrared spectrometry.

This apparatus makes it possible to obtain a degree of destruction, on the downstream side of the dehydration unit 68, comparable to that obtained using a surfatron-guide.

This is because, in the table given in FIG. 7, it may be seen that the apparatus of FIG. 6, which uses a surfaguide provided with sleeves constituting an electromagnetic screen, has a destruction effectiveness which is very much greater than that of the conventional surfaguide which is not provided therewith and which therefore allows some radiation to leak out.

In the embodiment shown, the diameter of the orifices, such as 38 provided in the part making up the central part and defining the passage for the tube 40, has a value close to that of the external diameter of this tube.

According to an advantageous variant, the diameter of the passage 38 is greater than the external diameter of the tube 40. For example, for a discharge tube 40 having an external diameter approximately equal to 15 mm, the diameter of the passage is preferably chosen to be between 20 and 22 mm so as to leave a gap between the wall making up the central part 32 and the tube 40.

According to this embodiment, the microwave energy is no longer concentrated in the launching gap of the device in the immediate vicinity of the wall of the tube 40. It therefore makes it possible to work at higher powers so as to achieve a higher efficiency of the device without the risk of failure.

In the embodiment example just described, the sleeves have a cylindrical shape.

However, it would be possible, as a variant, to provide the device with sleeves having a cross-section of different shape, for example rectangular, oval, etc., or to use substantially frustoconical sleeves.

Furthermore, it would be possible to replace the holes allowing the plasma created to be viewed by any other type of appropriate means, such as a grid or a slot, at least one dimension of which is sufficiently small to prevent losses by the radiation passing to the outside.

What is claimed is:

1. Device for exciting a gas comprising:

a hollow structure forming a waveguide, made of an electrically conductive material, connected to a microwave generator and including a passage for a hollow dielectric tube adapted for flow of the gas to be excited, said hollow structure further including a wave-concentrating region designed to concentrate microwave radiation produced by the generator onto the tube, during operation of the device, for the purpose of producing a surface wave plasma in the gas, and at least two electromagnetic screening sleeves made of a conductive material, fastened to said hollow structure and extending along the extension of said passage so as to surround said hollow tube, said sleeves extending along the extension of one with respect to the other, on each side of the central part, wherein each sleeve includes an end mounting plate, each mounting plate extending laterally beyond the central part to fix said sleeves to said hollow structure by bolting the mounting plates together, wherein the hollow structure forming the waveguide has a longitudinal general shape and includes a first open end adapted to be connected to said microwave generator, an opposite open end adapted to be provided with a means for forming a short-circuit, and a region of narrowed cross-section which extends between said first open end and said opposite open end and delimits said wave-concentrating region, said region of narrowed cross-section including a central part of constant cross-section equipped with said passage extending between two parts of cross-section which increases linearly towards said ends.

2. Device according to claim 1, wherein said sleeves have lengths and said plasma created in the gas has a length such that the lengths of said sleeves are at least equal to the length of the plasma created in the gas.

3. Device according to claim 2, wherein each sleeve comprises a free end which comprises a flange provided with a hole for passage of said dielectric tube.

4. Device according to claim 2, wherein said sleeves have lengths equal to a sum of the length of the plasma and of the wavelength of said microwave radiation in a vacuum.

5. Device according to claim 1, wherein said sleeve comprises a wall provided with at least one orifice for viewing the plasma, said orifice having dimensions which are designed to prevent penetration of the radiation.

6. Device according to claim 5, wherein said sleeves have a cylindrical general shape of cross-section at least equal to twice a cross-section of the hollow tube.

7. Device according to claim 1, wherein the passage and the hollow tube have diameters such that the diameter of the passage is greater than the external diameter of the hollow tube.

8. Apparatus for treating a gas, comprising a device for exciting a gas according to claim 1, and at least one unit for treating the reactive compounds being placed on a downstream side of the hollow dielectric tube.

9. Device for exciting a gas comprising:

a hollow structure forming a waveguide, made of an electrically conductive material, connected to a microwave generator and including a passage for a hollow dielectric tube adapted for flow of the gas to be excited, said hollow structure further including a wave-concentrating region designed to concentrate microwave radiation produced by the generator onto the tube, during operation of the device, for the purpose of producing a surface wave plasma in the gas, at least one electromagnetic screening sleeve made of a conductive material, fastened to said hollow structure and extending along the extension of said passage so as to surround said hollow tube, wherein said at least one sleeve comprises a wall provided with at least one orifice for viewing the plasma, said orifice having dimensions which are designed to prevent penetration of the radiation.

10. Device according to claim 9, wherein the hollow structure forming a waveguide has a longitudinal general shape and includes a first open end adapted to be connected to said microwave generator, an opposite open end adapted to be provided with a means for forming a short-circuit, and a region of narrowed cross-section which extends between said first open end and said opposite open end and delimits said wave-concentrating region.

11. Device according to claim 10, wherein said region of narrowed cross-section includes a central part of constant cross-section equipped with said passage extending between two parts of cross-section which increases linearly towards said ends.

12. Device according to claim 11, wherein said at least one sleeve comprises two sleeves which extend along the extension of one with respect to the other, on each side of the central part.

13. Device according to claim 9, wherein said at least one sleeve has a length and said plasma created in the gas has a length such that the length of said at least one sleeve is at least equal to the length of the plasma created in the gas.

14. Device according to claim 13, wherein each sleeve comprises a free end which comprises a flange provided with a hole for passage of said dielectric tube.

15. Device according to claim 13, wherein said at least one sleeve has a length equal to a sum of the length of the plasma and of the wavelength of said microwave radiation in a vacuum.

16. Device according to claim 9, wherein said at least one sleeve has a cylindrical general shape of cross-section at least equal to twice a cross-section of the hollow tube.

17. Device according to claim 9, wherein the passage and the hollow tube have diameters such that the diameter of the passage is greater than the external diameter of the hollow tube.

18. Apparatus for treating a gas, comprising a device for exciting a gas according to claim 9, and at least one unit for treating the reactive compounds being placed on a downstream side of the hollow dielectric tube.

* * * * *